United States Patent
Huang et al.

(10) Patent No.: US 8,451,615 B2
(45) Date of Patent: May 28, 2013

(54) PRINTED CIRCUIT BOARD

(75) Inventors: Tsung-Sheng Huang, Tu-Cheng (TW);
Chun-Jen Chen, Tu-Cheng (TW);
Duen-Yi Ho, Tu-Cheng (TW);
Wei-Chieh Chou, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 103 days.

(21) Appl. No.: 13/087,488

(22) Filed: Apr. 15, 2011

(65) Prior Publication Data
US 2012/0243194 A1    Sep. 27, 2012

(30) Foreign Application Priority Data
Mar. 23, 2011    (TW) .............................. 100109815 A

(51) Int. Cl.
*H05K 7/00* (2006.01)

(52) U.S. Cl.
CPC ........................................ *H05K 7/00* (2013.01)
USPC .......................................... 361/760; 174/262

(58) Field of Classification Search
CPC ........................................................ H05K 1/18
USPC ......... 361/760, 763, 764, 777, 780; 174/262, 174/260; 29/846
See application file for complete search history.

(56) References Cited

U.S. PATENT DOCUMENTS

| | | | |
|---|---|---|---|
| 6,198,362 B1* | 3/2001 | Harada et al. | 333/12 |
| 7,233,061 B1* | 6/2007 | Conn | 257/686 |
| 7,385,792 B2* | 6/2008 | Kanayama et al. | 361/18 |

* cited by examiner

*Primary Examiner* — Yuriy Semenenko
(74) *Attorney, Agent, or Firm* — Altis Law Group, Inc.

(57) ABSTRACT

A printed circuit board includes a top layer and a bottom layer. A power supply and an electronic component are located on the top layer. The power supply is connected to the top layer and the bottom layer through a first via. A number of second vias extends through the top layer and the bottom layer, and is electrically connected to the top layer and the bottom layer. A right-angled triangular void area without vias defined therein is formed on the printed circuit board, between the second vias and the electronic component. The second vias are arranged on a hypotenuse of the void area.

2 Claims, 4 Drawing Sheets

US 8,451,615 B2

PRINTED CIRCUIT BOARD

BACKGROUND

1. Technical Field

The present disclosure relates to a printed circuit board.

2. Description of Related Art

Referring to FIGS. 3 and 4, some current printed circuit boards (PCBs) include a top layer 1, a bottom layer 2, a signal layer 3, and a ground layer 4. The top layer 1 and the bottom layer 2 are power layers. An electronic component 5 located on the top layer 1 is electrically connected to the top layer 1 and the bottom layer 2 through two vertical interconnect accesses (vias) 5a and 5b. Vias, such as 6a, 6b, 6c, 9a, 9b, and 9c are defined through the PCB, and are electrically connected to the top layer 1 and the bottom layer 2. A power supply 8 located on the top layer 1 is electrically connected to the top layer 1 and the bottom layer 2 through two vias 8a and 8b, to supply power to the electronic component 5. A part of the current from the power supply 8 flows to the electronic component 5 through the top layer 1. Another part of the current flows to the bottom layer 2 through the vias 8a, 8b, 6a, 6b, and 6c at first, then returns to the top layer 1 through the vias 9a, 9b, 9c, 5a, and 5b, thereby flowing to the electronic component 5 through the top layer 1. Because the current will flow to the electronic component 5 through a path with the least resistance, the current on the bottom layer 2 will flow to the top layer 1 through the via 9c which is the closest to the electronic component 5. As a result, if the current passing through the via 9c is too high, the resulting high temperature created may make the PCB unstable or may even damage the PCB.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
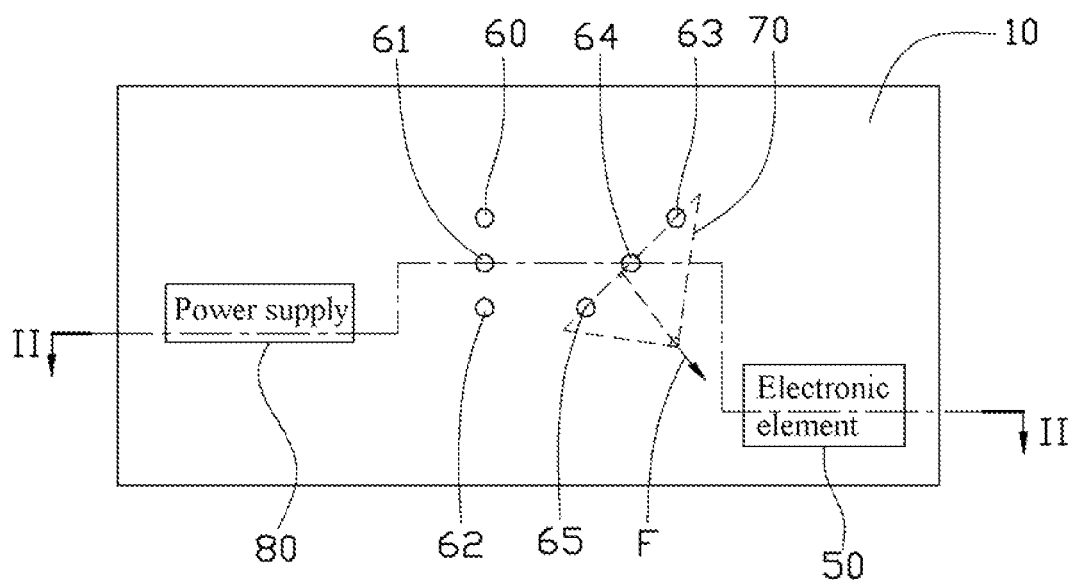
FIG. 1 is a schematic diagram of an exemplary embodiment of a printed circuit board.
Figure 2:
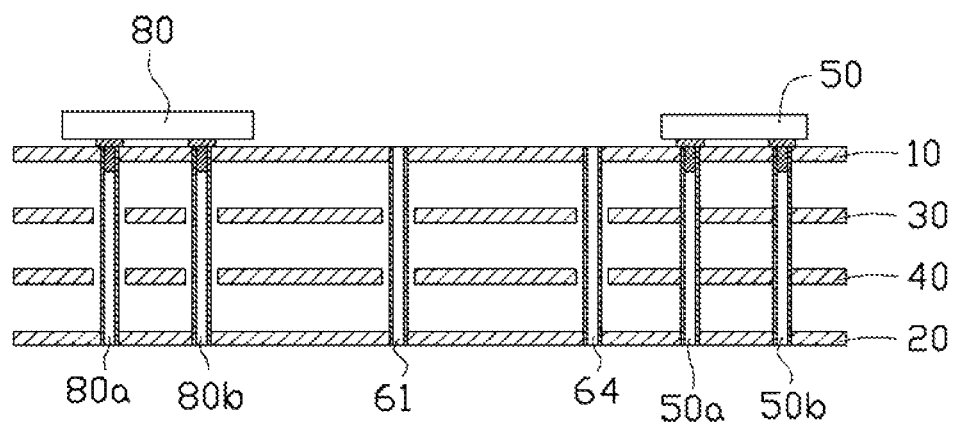
FIG. 2 is a sectional view of the printed circuit board of FIG. 1, taken along the line II-II.
Figure 3:
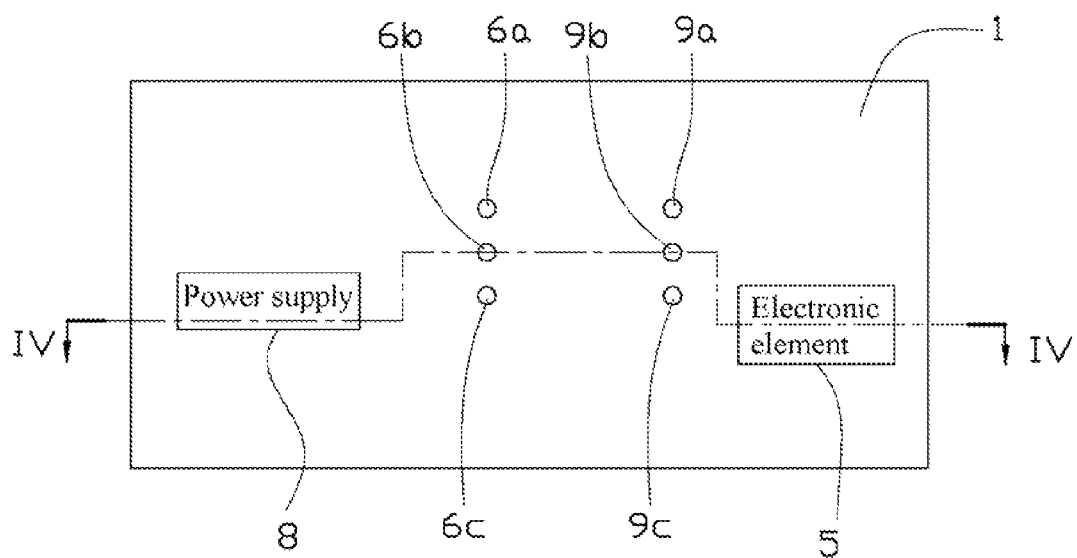
FIG. 3 is a schematic diagram of a conventional printed circuit board.
Figure 4:
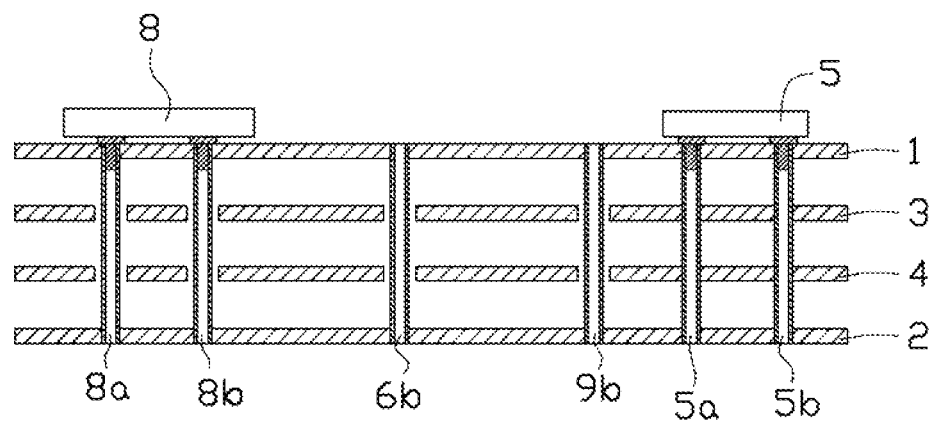
FIG. 4 is a sectional view of the printed circuit board of FIG. 3, taken along the line IV-IV.

Referring to FIGS. 1 and 2, an exemplary embodiment of a printed circuit board (PCB) includes a top layer 10, a bottom layer 20, a ground layer 30, and a signal layer 40. The top layer 10 and the bottom layer 20 are power layers. An electronic component 50 located on the top layer 10 is electrically connected to the top layer 10 and the bottom layer 20 through two vertical interconnect accesses (vias) 50a and 50b. A plurality of vias extends through the PCB and is electrically connected to the top layer 10 and the bottom layer 20. In the embodiment, the plurality of vias includes six vias 60-65.

A power supply 80 is located on the top layer 10, and is electrically connected to the top layer 10 and the bottom layer 20 through two vias 80a and 80b, to supply power to the electronic component 50. A part of the current from the power supply 80 flows to the electronic component 50 through the top layer 10. Another part of the current from the power supply 80 flows to the bottom layer 20 through the vias 80a, 80b, and 60-62 at first, and then returns to the top layer 10 through the vias 50a, 50b, and 63-65, thereby flowing to the electronic component 50 through the top layer 10.

The vias 60-62 are formed in a first row, and the vias 63-65 are formed in a second row nearer the electronic component 50 than the first row of vias 60-62. A right-angled triangular void area 70 without vias defined therein is formed on the PCB, between the second row of vias 63-65 and the electronic component 50. The second row of vias 63-65 is arranged on the hypotenuse of the void area 70. Because the current through the bottom layer 20 flows to the electronic component 50 through a path with the least resistance, paths of the current flowing to the electronic component 50 from the second row of vias 63-65 are substantially parallel to the arrow F, that is, substantially perpendicular to the hypotenuse of the void area 70.

Because the current through the bottom layer 20 flows to the electronic component 50 through a path with the least resistance, the current through the bottom layer 20 flows to the top layer 10 through the vias 63-65 which are the closest vias to the electronic component 50. Because the current flowing to the electronic component 50 is divided by the vias 63-65, current through each of the vias 63-65 of the PCB will not be excessive, and therefore, each of the vias 63-65 will not over-heat.

The foregoing description of the exemplary embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A printed circuit board (PCB) comprising:
   a top layer;
   a power supply and an electronic component separately mounted on and electrically connected to the top layer;
   a bottom layer; and
   at least one first vertical interconnect access (via) extending through the top layer and the bottom layer, to electrically connect the power supply to the bottom layer; and
   a plurality of second vias extending through the top layer and the bottom layer and electrically connected to the top layer and the bottom layer, wherein a right-angled triangular void area without vias defined therein is formed on the PCB, between the plurality of second vias and the electronic component, the plurality of second vias is arranged on a hypotenuse of the void area, and paths of current flowing from the plurality of second vias to the electronic component are substantially perpendicular to the hypotenuse of the void area, such that the plurality of second vias substantially evenly divides the current to prevent over-heating of the plurality of second vas.

2. The PCB of claim 1, wherein the top layer and the bottom layer are power layers.

* * * * *